(12) United States Patent
Hofmeister

(10) Patent No.: US 6,493,253 B2
(45) Date of Patent: Dec. 10, 2002

(54) DRAM MEMORY CELL

(75) Inventor: Klaus Hofmeister, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/999,326

(22) Filed: Oct. 31, 2001

(65) Prior Publication Data

US 2002/0060925 A1 May 23, 2002

(30) Foreign Application Priority Data

Oct. 31, 2000 (DE) .......................... 100 53 966

(51) Int. Cl.[7] .............................................. G11C 11/24
(52) U.S. Cl. ...................... 365/149; 257/303; 257/296
(58) Field of Search ................... 365/149; 257/303, 257/296

(56) References Cited

U.S. PATENT DOCUMENTS

| 5,155,573 A | * | 10/1992 | Abe et al. .................... 257/304 |
| 5,166,090 A | * | 11/1992 | Kim et al. .................... 438/253 |
| 5,237,528 A | * | 8/1993 | Sunami et al. ............... 365/149 |
| 5,455,192 A | * | 10/1995 | Jeon ............................ 438/244 |
| 5,795,804 A | | 8/1998 | Jenq |
| 6,018,177 A | * | 1/2000 | Chi ............................. 257/296 |

FOREIGN PATENT DOCUMENTS

EP            0 398 249 A2    11/1990

* cited by examiner

*Primary Examiner*—Huan Hoang
(74) *Attorney, Agent, or Firm*—Laurence A. Greenberg; Werner H. Stemer; Gregory L. Mayback

(57) ABSTRACT

A DRAM memory cell includes a storage capacitor device with two storage capacitors connected in parallel with one another. One of the storage capacitors is a trench capacitor whereas the other one of the storage capacitors is a stacked capacitor.

2 Claims, 1 Drawing Sheet

DRAM MEMORY CELL

BACKGROUND OF THE INVENTION

Field of the Invention

The invention relates to a DRAM (Dynamic Random Access Memory) cell including a storage capacitor device and a selection transistor, which are provided at least partly in a semiconductor body.

As is known, DRAM memory cells can store the information contained in them only for a specific time. This is because the information is present in the memory cell as an electric charge in a storage capacitor having a specific capacitance.

The loss of charge and hence information in the storage capacitor takes place through various mechanisms, such as leakage currents through the dielectric of the storage capacitor, stray currents between the capacitor electrodes and other conductors which are at a potential that differs from the potential of the capacitor electrodes, etc.

If the capacitance of a storage capacitor could theoretically be increased as desired, then the charge in this storage capacitor could also be preserved for as long as desired.

Conversely, the time period during which the charge is retained in a storage capacitor decreases with a decreasing capacitance of the capacitor. Since the capacitance of a capacitor is essentially proportional to its dimensions, its size significantly influences the information storage time.

However, the size of storage capacitors is continually being reduced with ever smaller structural dimensions. Through skillful dimensioning of trench cells accommodating storage capacitors, it has been possible hitherto, despite the diminishing structural dimensions, to keep the storage time essentially constant, that is to say to compensate for the reduced structural dimensions. Solutions for this goal are achieved with deeper trenches, thinner dielectrics of the storage capacitors, dielectrics having higher dielectric constants, etc.

Nevertheless, limits are also imposed on the depth of the trenches in conjunction with a smaller diameter or the widening of the trenches deep in the semiconductor material ("bottled trenches") or the introduction of dielectrics having higher dielectric constants. Moreover, the complexity of the fabrication process increases if, for example, special dielectrics having higher dielectric constants or trenches widened in their depth are used in order to compensate for the reduction in capacitance accompanying the miniaturization of the structural dimensions.

SUMMARY OF THE INVENTION

It is accordingly an object of the invention to provide a DRAM memory cell which overcomes the above-mentioned disadvantages of the heretofore-known memory cells of this general type and with which, even in the case of advancing miniaturization of the structural dimensions, the reduction in capacitance can be counteracted, thereby making it possible to prevent a decrease in the storage time.

With the foregoing and other objects in view there is provided, in accordance with the invention, a DRAM memory cell, including:
a semiconductor body;
insulating layers disposed on the semiconductor body, the insulating layers having contact holes formed therein;
a storage capacitor device provided at least partly in the semiconductor body, the storage capacitor device including at least a first storage capacitor and a second storage capacitor connected in parallel with one another;
the first storage capacitor being a trench capacitor disposed in the semiconductor body;
the second storage capacitor being a stacked capacitor disposed on the semiconductor body such that the second storage capacitor is located above the first storage capacitor;
the second storage capacitor being electrically connected to if the first storage capacitor via the contact holes in the insulating layers; and
a selection transistor provided at least partly in the semiconductor body.

In other words, the object of the invention is achieved by virtue of the fact that the storage capacitor device includes at least two storage capacitors connected in parallel with one another, of which one is provided in the semiconductor body and the other is provided on the semiconductor body.

In the case of the DRAM memory cell according to the invention, two storage capacitors, one of which is preferably a trench storage capacitor, while the other storage capacitor is formed by a stacked capacitor on the semiconductor body, are connected in parallel with one another, so that the capacitance of the stacked capacitor formed on the surface of the semiconductor body contributes to an increased capacitance of the storage capacitor device. The trench storage capacitor can be introduced into the semiconductor body in a customary manner in accordance with the trench concept through the use of an etching step, while the stacked capacitor on the surface of the semiconductor body includes at least two capacitor electrodes which lie parallel to one another and are isolated from one another by a dielectric. In order to enlarge the electrode area, the electrodes may also be "intermeshed" in one another and in this case have a tree-like structure, for example. The stacked capacitor is preferably provided above the trench capacitor, so that no additional area is taken up for the stacked capacitor.

The two capacitors are connected, in parallel with one another, to the selection transistor, whose gate is connected to a word line and whose drain has a bit line contact to a bit line. In this case, the selection transistor may be embodied either laterally or vertically. The source of the selection transistor is connected to a node between the two storage capacitors connected in parallel with one another. The other two electrodes of the two storage capacitors may be connected to ground.

The storage capacitor device preferably includes two storage capacitors connected in parallel with one another. However, it is also possible, of course, for three or more, rather than two, storage capacitors also to be connected in parallel and jointly connected to a selection transistor in order thus to further increase the capacitance of the storage capacitor device of the DRAM memory cell.

The semiconductor body is preferably composed of silicon. However, it is also possible, of course, to use other semiconductor materials, such as, for example, $A_{III}B_V$ semiconductor materials or SiC.

Other features which are considered as characteristic for the invention are set forth in the appended claims.

Although the invention is illustrated and described herein as embodied in a DRAM memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
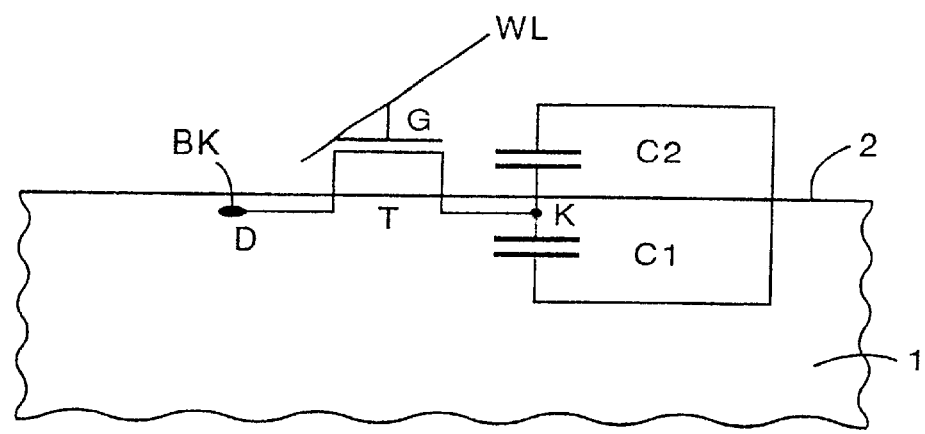
FIG. 1 is a schematic view of the DRAM memory cell according to the invention.

Referring now to the figures of the drawings in detail and first, particularly, to FIG. 1 thereof, there is shown a DRAM memory cell having a semiconductor body 1 made of p-conducting silicon, for example, in which a selection transistor T and a trench storage capacitor C1 are accommodated. In parallel with the trench storage capacitor C1 there is a stacked storage capacitor C2, which is provided on a main surface 2 of the semiconductor body 1. The gate G of the selection transistor T is connected to a word line WL. The drain (or source) of the selection transistor has a bit line contact BK, which is connected to a bit line (not shown) running on the surface 2 of the semiconductor body 1. The source (or drain) of the selection transistor T is connected to a node K between the storage capacitors C1 and C2, whose other electrodes are at a common potential, for example ground.

In this DRAM memory cell, the storage capacitor device includes the two storage capacitors C1 and C2 connected in parallel with one another, with the result that the storage capacitor device has overall a relatively large capacitance composed additively of the capacitance of the trench storage capacitor C1 and the capacitance of the stacked storage capacitor C2.

Figure 2:
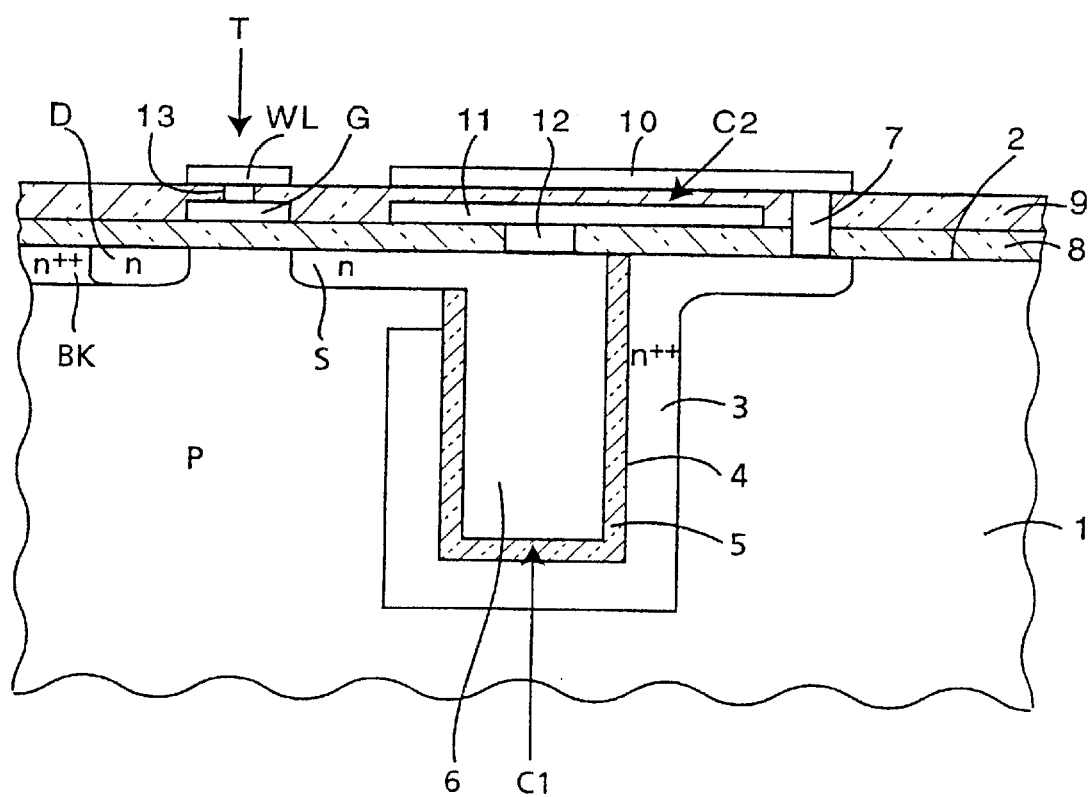
FIG. 2 is a diagrammatic, partial sectional view of a DRAM memory cell in accordance with an exemplary embodiment of the invention.

FIG. 2 illustrates the DRAM memory cell of FIG. 1 in an exemplary embodiment. In this case, the same reference symbols as in FIG. 1 are used for corresponding structural parts in FIG. 2.

The storage capacitor C1 is formed by a trench storage capacitor including an $n^{++}$-conducting layer 3 around a trench 4 as a first electrode, an insulator layer 5 lining the trench 4 and made, for example, of silicon dioxide or silicon nitride as dielectric, and a polycrystalline silicon filling 6 as a second capacitor electrode. The filling 6 is connected to the source S of the selection transistor T and the layer 3 is connected via a metal plug 7, which leads through insulator layers 8, 9 made of silicon dioxide and/or silicon nitride, to a top electrode 10 of the second storage capacitor C2, which is configured as a stacked capacitor. A second electrode 11 of this storage capacitor C2 is connected via a metallic connection 12 to the polycrystalline silicon filling 6 of the first storage capacitor C1. The dielectric of the second storage capacitor C2 is formed by the insulator layer 9.

The selection transistor T may, if appropriate, also be formed vertically instead of laterally.

The storage capacitor C2 is illustrated only in a simplified manner here. It may, of course, also have the abovementioned tree-like structure for enlarging its electrode area. It should at any rate be configured such that the area above the trench capacitor C1 is fully utilized.

The bit line contact BK of the drain D of the selection transistor T is connected to a bit line (not shown in FIG. 2) which, for example, may run between the insulator layers 8 and 9. The word line WL is connected via a contact hole 13 to the gate G of the selection transistor T.

I claim:

1. A DRAM memory cell, comprising:

a semiconductor body defining a trench;

insulating layers disposed on said semiconductor body, said insulating layers having contact holes formed therein;

a storage capacitor device provided at least partly in said semiconductor body, said storage capacitor device including at least a first storage capacitor and a second storage capacitor connected in parallel with one another;

said first storage capacitor being a trench capacitor disposed in said trench of said semiconductor body, said first storage capacitor having an insulating layer lining said trench to form a dielectric of said first storage capacitor;

said second storage capacitor being a stacked capacitor disposed on said semiconductor body and in said insulating layers such that said second storage capacitor is located above said first storage capacitor and one of said insulating layers forms a dielectric of said second storage capacitor;

said second storage capacitor being electrically connected to said first storage capacitor via said contact holes in said insulating layers; and a selection transistor provided at least partly in said semiconductor body.

2. The DRAM memory cell according to claim 1, wherein:

said selection transistor has a gate, a drain, and a source;

a world line is connected to said gate of said selection transistor;

said first storage capacitor and said second storage capacitor have respective first capacitor electrodes and respective second capacitor electrodes;

one of said source and said drain of said selection transistor is connected to said first capacitor electrodes; and said second capacitor electrodes are connected to a reference potential.

* * * * *